(12) United States Patent
Touwslager et al.

(10) Patent No.: US 8,563,868 B2
(45) Date of Patent: Oct. 22, 2013

(54) ELECTRONIC DEVICE FOR A FLEXIBLE DISPLAY DEVICE AND METHOD THE SAME

(75) Inventors: Fredericus J. Touwslager, Veldhoven (NL); Gerwin Gelinck, Valkenswaard (NL); Petrus Cornelis Paulus Bouten, Eindhoven (NL)

(73) Assignee: Creator Technology B.V., Breda (NL)

( * ) Notice: Subject to any disclaimer, the term of this patent is extended or adjusted under 35 U.S.C. 154(b) by 1069 days.

(21) Appl. No.: 12/306,838

(22) PCT Filed: Jun. 28, 2007

(86) PCT No.: PCT/NL2007/050316
§ 371 (c)(1),
(2), (4) Date: Sep. 18, 2009

(87) PCT Pub. No.: WO2008/002140
PCT Pub. Date: Jan. 3, 2008

(65) Prior Publication Data
US 2010/0018743 A1    Jan. 28, 2010

Related U.S. Application Data

(60) Provisional application No. 60/806,059, filed on Jun. 28, 2006.

(51) Int. Cl.
*H05K 1/00*    (2006.01)

(52) U.S. Cl.
USPC ........... 174/254; 174/250; 174/258; 174/262; 361/749; 361/792

(58) Field of Classification Search
USPC .......................... 174/250–258; 361/749, 792
See application file for complete search history.

(56) References Cited

U.S. PATENT DOCUMENTS

| 4,659,872 | A | 4/1987 | Dery et al. |
| 6,506,978 | B1 * | 1/2003 | Furihata .................... 174/254 |
| 2005/0074578 | A1 | 4/2005 | Yamaguchi et al. |

FOREIGN PATENT DOCUMENTS

| CN | 1659473 A | 8/2005 |
| EP | 1074997 A2 | 2/2001 |
| GB | 2222327 A | 2/1990 |
| JP | 61-94025 | 5/1986 |
| WO | WO 97/27646 | 7/1997 |
| WO | WO 02/054414 A2 | 7/2002 |
| WO | WO 2004/110119 A1 | 12/2004 |

OTHER PUBLICATIONS

International Search Report PCT/NL2007/050316 dated Oct. 5, 2007.
Translation of Examiner's Comments in Office Action dated Oct. 27, 2010, for corresponding Chinese Application No. 200780031314.6.

* cited by examiner

*Primary Examiner* — Tuan T Dinh (57) ABSTRACT

An electronic device (100) includes a first plane (102) and a second plane (103) where one of the planes can be deformed under mechanical pressure. A common contact region forms a cavity (145) on at least one of the first and second planes. An electrical connection (110) is configured to complete an electrical connection between the first and second planes wherein the electrical connection includes a solidified form of a liquid conductor dispensed in the cavity to complete an electrical path between the first and second planes.

20 Claims, 8 Drawing Sheets

ELECTRONIC DEVICE FOR A FLEXIBLE DISPLAY DEVICE AND METHOD THE SAME

FIELD OF THE INVENTION

This disclosure relates to electronic devices, and more particularly to an improved common contact layout for flexible displays.

BACKGROUND

In a common contact for a flexible display, an electrical connection has to be made between a front plane laminate and an (active matrix) backplane. Problems arise during deflection of a top substrate during the lamination of the front plane. Controlling this deflection is desirable from the stand point of a common contact region in a display as will be explained. For displays that include two portions that need to be electrically connected, an anisotropic conducting sticker is currently employed to make the electrical connection between say a front plane conductive layer (e.g., the ITO) and a common contact on the back plane. This method suffers from several drawbacks.

In particular, there are three problems with the currently used solution for making the common contact:

1) The anisotropic sticker includes large irregular shaped metal particles which can damage the ITO layer during lamination. A common contact sticker includes irregular shaped metal particles over a common contact region. This may lead to unstable electrical contacts and the particles can damage adjacent layers.

Figure 1A:
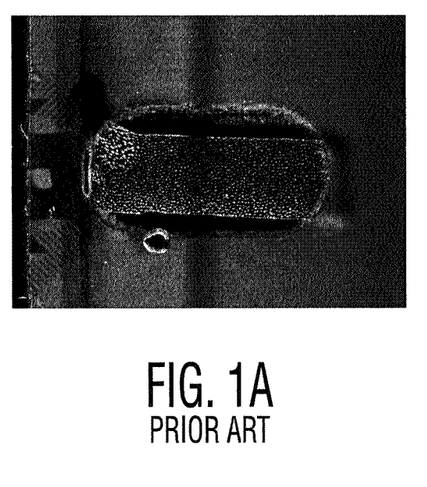
FIGS. 1A and 1B are magnified images showing inadequate coverage and height differences between a contact sticker and a common contact in accordance with the prior art.
Figure 1B:
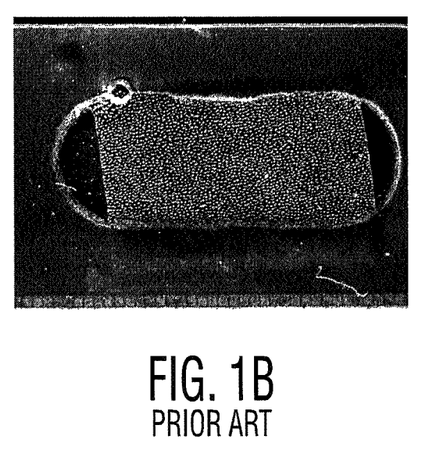

2) The contact sticker should fit exactly or nearly exactly over the common contact site, as height differences and non-sticking areas may initiate buckling at the edges of the conducting tape. Height differences between the common contact, the sticker and surrounding areas are clearly observed in FIGS. 1A and 1B. In FIGS. 1A and 1B, two typical examples of the size mismatch between the common contact area (oval shape) and the common contact sticker (rectangular shape over the common contact area) can be seen. Also note the irregularly shaped metals particles visible in FIGS. 1A and 1B.

3) The current process to apply the stickers is a manual process and therefore expensive.

SUMMARY OF THE INVENTION

In accordance with present embodiments, a flexible display device includes a first plane, a second plane, and a common contact region on one of the first and second planes. An electrical connection is configured to complete an electrical connection between the first and second planes wherein the electrical connection includes a solid form of a liquid conductor applied to the common contact area to complete an electrical path between the first and second planes.

An electronic device includes a first plane and a second plane where one of the planes can be deformed under mechanical pressure. A common contact region forms a cavity on at least one of the first and second planes. An electrical connection is configured to complete an electrical connection between the first and second planes wherein the electrical connection includes a solidified form of a liquid conductor dispensed in the cavity to complete an electrical path between the first and second planes.

In particularly useful embodiments, the use of an isotropic conductor is provided. In another embodiment, from the point of view of manufacturability, application of a conducting adhesive as a paste or highly viscous liquid is preferable. However, deflections during a lamination process can cause the adhesive to be removed from the common contact area. Preventing the deflection by adding spacers might crack layers on the front plane laminate (e.g., an indium tin oxide (ITO) layer). However, if used appropriately spacers may be employed.

These and other objects, features and advantages of the present disclosure will become apparent from the following detailed description of illustrative embodiments thereof, which is to be read in connection with the accompanying drawings.

BRIEF DESCRIPTION OF THE DRAWINGS

This disclosure will present in detail the following description of preferred embodiments with reference to the following figures wherein.

DETAILED DESCRIPTION OF THE DRAWINGS

Embodiments described herein are directed to electronic display technology, and in particular are directed to flexible displays with a common contact region or area employed for electrically connecting a front plane and a back plane of a display device. In one useful embodiment, a flexible display is provided with an isotropic conductor in a common contact region connecting a front plane laminate to an (active matrix) backplane. A method of manufacturing the display is also described. In another embodiment, a conducting adhesive is applied as a paste or highly viscous liquid to form the contact. The shape of the common contact is chosen such that, its dimension in one direction or two directions is below a threshold (e.g., <1 mm).

In one embodiment, steps to reduce or eliminate deflection of a top (flexible) substrate during the lamination of the front plane is provided, thus preventing the adhesive from being squeezed out and only partly filling the common contact area. The present embodiments avoid problems caused by: (1) the anisotropic sticker, which includes large irregular shaped metal particles which can damage the ITO layer during lamination, (2) the contact sticker not fitting exactly in the common contact site which results in height differences and non-sticking areas initiating buckling at the edges of the conducting tape, and (3) the expense of applying the stickers in a manual process.

It should be understood that the present invention will be described in terms of flexible displays; however, the teachings of the present invention are much broader and are applicable to any display technology type or any other device or component that needs a common node connection. In particular, embodiments in accordance with present principles can be used in all devices in which a flexible substrate is electrically coupled to a second substrate. It should also be understood that the illustrative examples of the common contact may be adapted to include additional electronic connections. These connections may be employed in semiconductor packaging applications, printed wiring board applications, electronic components and computer assembly applications or any other application where a mechanical electrical connection may be made.

Examples of the present embodiments include matrix arrays of electrical devices (back plane) coupled to a front plane including sensing and/or displaying elements that have a connection area or common electrode region. A particularly useful example is a flexible active-matrix display as described hereinafter.

Figure 2:
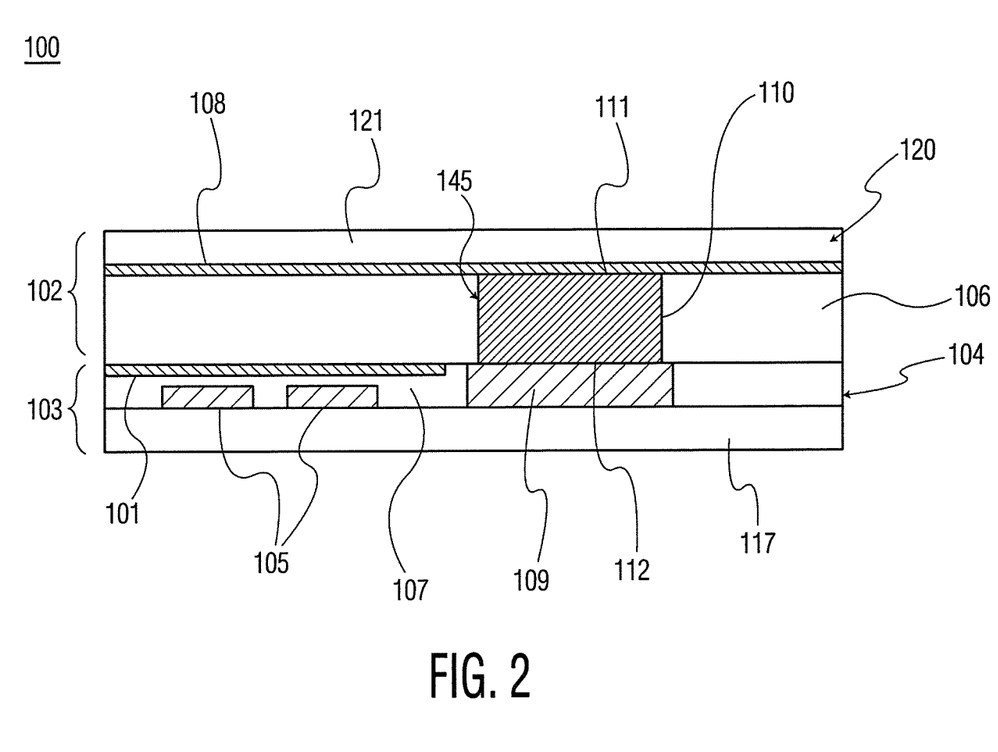
FIG. 2 is a cross-sectional view showing first and second planes connected by an electrical connection in the common contact area in accordance with present principles.

Referring now to the drawings in which like numerals represent the same or similar elements and initially to FIG. 2, an illustrative display device 100 includes two main parts or portions 102 and 103. Although the display 100 will be described in terms of a flexible display employing microcapsules containing electrophoretic ink particles, such as the electronic ink technology recently made available from E Ink Corporation of Cambridge, Mass., any display or electronic device may benefit from the teachings herein. The first part 103 includes an active-matrix back plane including e.g., organic electronic thin-film transistors (TFTs) 105 on a backplane substrate material 117. In the present application, the material 117 may include polymer, metal, glass, etc.

The TFT's 105 and other electrical structures (metal lines, isolators) are applied on top of the substrate 117 in the back plane 103, thus near the interface with an electrophoretic layer 106. The second part 102 includes electrophoretic (E ink) display effects in layer 106, which is laminated on top of the back plane 103. This second part 102 is also called a front plane laminate (FPL). A common contact area includes a region where the FPL 102 has to be electrically connected to the back plane 103. The common contact area is not a physical device; instead it is the location where the upper and the lower substrates are electrically connected. Contact pads 111 and 112 on front plane 102 and back plane 103 are parts of the common contact area. A conductor 110 (e.g., an isotropic sticker or adhesive) is also part of the common contact construction. The conductor 110 is used to make the electrical contact between a continuous underlying conductive layer 108, e.g., ITO, present on a top substrate 120, and a conductive material 109 on the back plane 103. This ITO 108 is one of the electrodes of a capacitor made to switch the E Ink in layer 106, while the other electrode of the capacitor is formed by a pixel pad 101 on layer 104 of the back plane 103. To be able to put the correct potential on the ITO electrode 108, the electrode 108 needs to be connected to the back plane 103.

To be able to do this, part of the resistive electrophoretic layer 106 is locally absent so that contact to an underlying conducting layer 108, which may include a transparent conductive material, such as ITO, lies bare. A layer 107 includes an insulating material, such as, e.g., polyethylene naphthalate (PEN). A top substrate 120 may include an insulation layer 121, e.g., a 25 micron polyethylene terephthalate layer (PET).

Figure 3A:
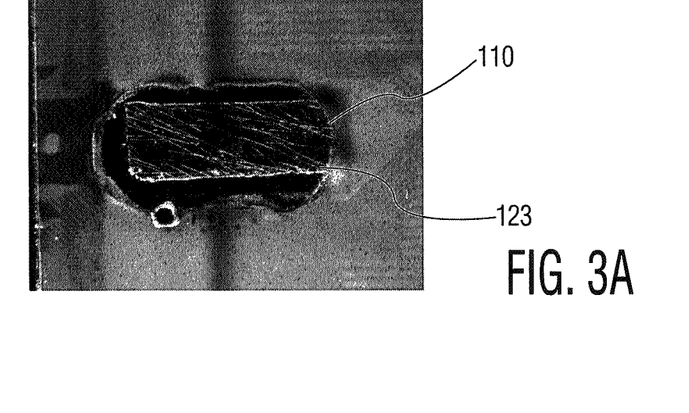
FIG. 3A is a magnified image showing an isotropic conductive sticker in accordance with one embodiment.
Figure 3B:
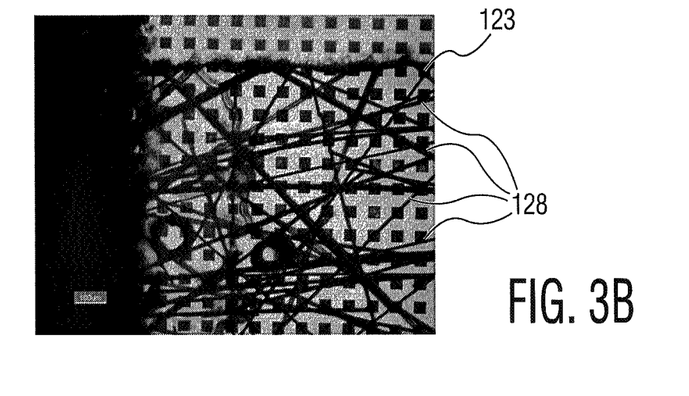
FIG. 3B is a magnified image showing metal wire of the isotropic conductive sticker of FIG. 3A under further magnification in accordance with the embodiment.

In accordance with illustrative embodiments, a conductive material or electrical connection 110 is applied to common electrode region to solve one or more of the problems outlined above. In one embodiment, conductive material 110 includes an isotropic conductive sticker. The sticker may be employed to solve problem 1, as described above; Instead of the hard metallic particles present in the anisotropic conducting stickers of the prior art, an isotropic sticker 123 includes small wires 128 as shown in FIGS. 3A and 3B. The use of an isotropic sticker is, however, only a partial solution, as problems 2 and 3, as described above, may not be fully addressed. The sticker 123 with these wires is one illustrative embodiment. Other types of isotropic conducting stickers may also be employed.

Figure 4:
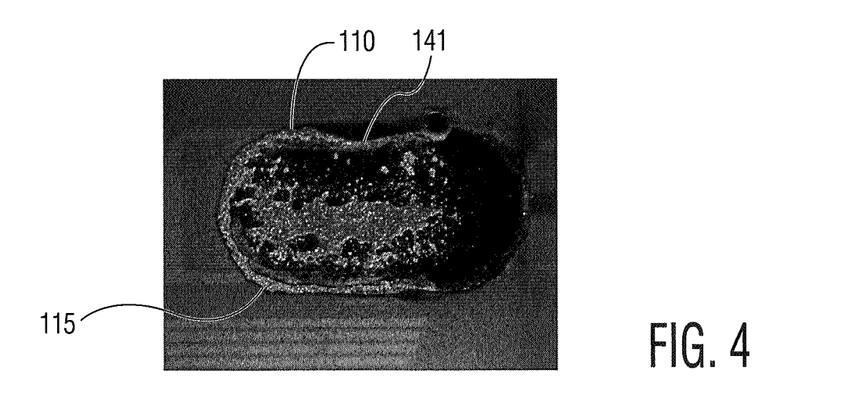
FIG. 4 is a magnified image showing a liquid conductor formed in a common contact area wherein the liquid has been squeezed out as a result of lamination pressure.

In another particularly useful embodiment, problems 1, 2 and 3 are all solved where conductive material 110 includes the application of a curable liquid conductor 115, illustratively shown in FIG. 4.

Referring to FIG. 4, in one embodiment, liquid conductor 115 includes a highly viscous liquid, which may be carefully dosed within a common contact area to form conductor 110. The dosing may be manual or automated, preferably automated to address problem 3. The height issues can also be solved using the liquid conductor 115.

In present embodiments where a liquid conductor 115 is employed, it should be understood that maintaining a clean contact area is of concern. For example, in an E-Ink cleaning process, a region near the E-Ink edge may not be completely clean, which if left alone reduces the width of the "E-Ink free" region thereby introducing a dirtier non-contacting surface. This is easily solved by due care and proper cleaning on the front or back planes 102 and 103 in the common contact region.

To immobilize the material of conductor 115, the material is preferably curable. In one embodiment, an ultraviolet (UV) curable conducting adhesive is employed; e.g., Norland™ NCA130™ is one suitable material. Applying NCA 130™ and subsequently laminating the FPL 106 provides conductor 110 as shown in FIGS. 5A and 5B.

In a particularly useful embodiment, a deposition method of the conducting adhesive or glue 115 may include direct printing, using, e.g., a single nozzle printer. In one embodiment, the conducting glue 115 includes a solvent-free, one-pot system, curable by heat and/or light. In another embodiment, the conducting glue 115 is a multiple layer process including e.g., a bilayer applied in two steps, where the first conducting layer promotes adhesion and/or improves the final contact mechanically, and the second conducting layer may improve conductivity. An example of such first conducting layer may include a conducting polymer composite such a polyaniline mixed with carbon nanotubes, or PEDOT-PSS, i.e., polythiophene derivative/polystyrene sulphonic acid. The second layer may include NCA 130™. Other suitable materials may be employed for these layers as well.

As depicted in FIG. 4, in some instances, a fraction of an area 141 is not covered with the conducting adhesive 115. This may occur in spite of the fact that there was more than enough material applied to completely cover the entire area initially. One reason for the removal of material of the liquid conductor 115 may be seen in FIGS. 5A-5B.

Figure 5A:
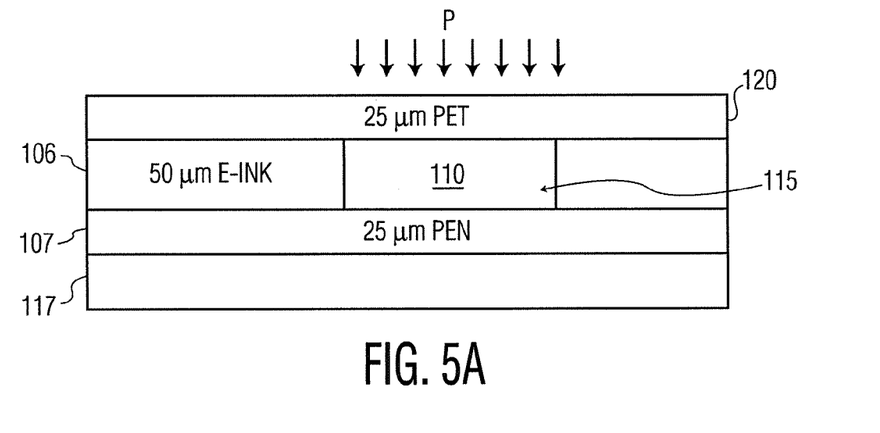
FIGS. 5A and 5B are cross-sectional views showing the application of lamination pressure and the response of the conductive liquid.
Figure 5B:
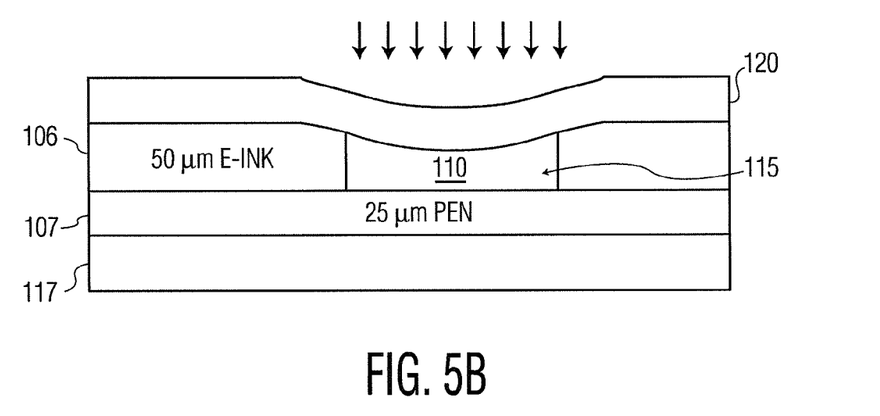

Referring to FIGS. 5A-5B, during lamination a pressure p is applied (by a lamination roll) on a top substrate 120 (FIG. 5A). This deflects the top substrate 120 over conductor 110 in the common contact area and squeezes out the viscous conducting adhesive 115 (FIG. 5B). After pressure removal, the top substrate 120 moves back towards its original position, and the adhesive front is drawn back; the adhesive only partly fills the volume in the common contact area.

Figure 6:
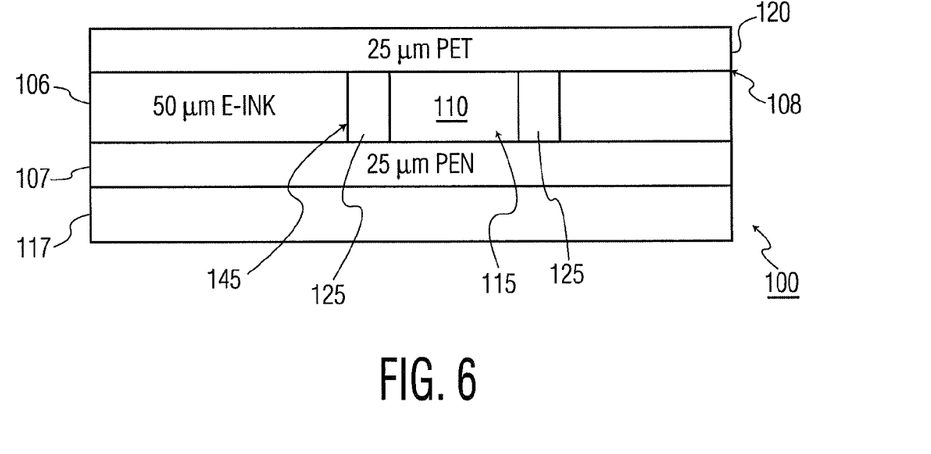
FIG. 6 is a cross-sectional view showing spacers formed in the common contact area in accordance with one embodiment.

Referring to FIG. 6, in one embodiment, the removal of the curable conductive liquid 115 is prevented by reducing the deflection caused by the lamination process. One way to reduce this deflection is to employ one or more spacers 125 on or next to conductor 110. Spacers 125 may include balls, blocks, fibers or other structures placed on the cured conductor 110, in the liquid form of conductor 110 or placed adjacent to the conductor 110.

During the lamination process, there is a risk of damaging the underlying conductive (ITO) layer 108, which would be in contact with the spacers 125. This risk can be minimized by avoiding the use of sharp, hard metal particles. Applications of spherical particles, ribs or column spacers lower this risk on damage. E.g., soft polymer spheres are better than the "hard" glass or metal spheres.

Any damage to the underlying conductive layer 108 may lead to reliability issues with respect to the electrical performance of the common contact 110. Also, damaging the underlying conductive layer 108 would mean that a water vapor transmission rate would locally become larger. This further leads to reliability issues for the display 100 due to higher relative humidities.

Another solution for limiting deflection due to the lamination process includes applying the conducting material 115 as a high viscous liquid, and adapting the shape of the conductor 110 to a cavity 145 formed in layer 106. It may be favorable to reduce the dimensions of a cavity 145 in the common contact area in one direction (e.g., width versus length) in favor of another direction.

Figure 7:
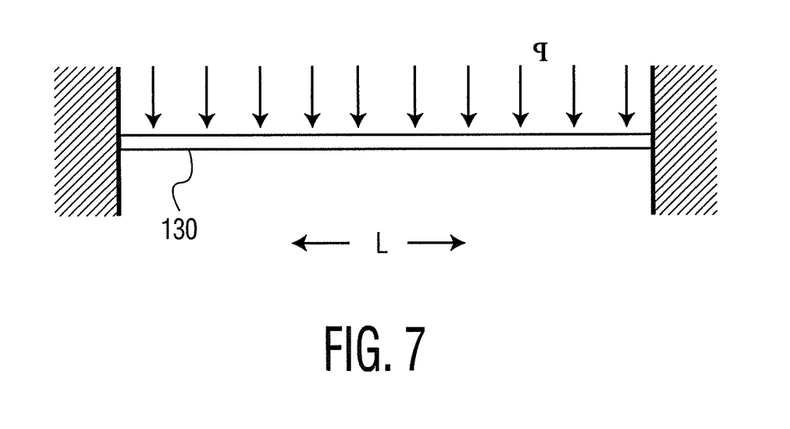
FIG. 7 is a diagram showing beam loading conditions for modeling a top substrate response in accordance with one embodiment.
Figure 8:
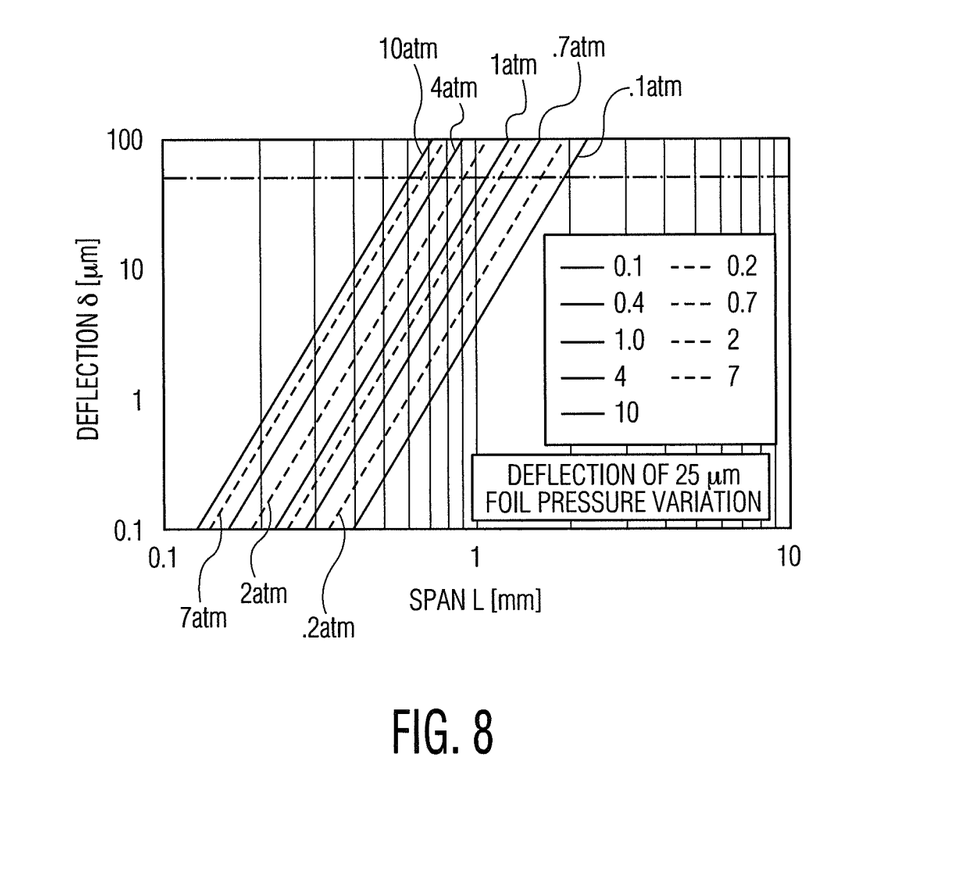
FIG. 8 is a log-log plot of deflection versus span length L under different pressures to assist in selecting processing conditions for laminating two parts of a flexible display.

Referring to again to FIG. 5B, to prevent deflection of the top substrate 120 at the location of the conductor 110, some of the geometrical and/or process parameters may be adjusted/optimized. As depicted in FIG. 7, the deflection of the substrate (120) at the location of the common contact area may include a simple edge-clamped beam 130 under a uniform applied pressure (q). The maximum deflection δ of this beam of length L is given in FIG. 8 as:

$$\delta = C_v q L^4 / D \quad (1),$$

where D is the flexural rigidity of a plate and $$D = E h^3 / \{12(1-v^2)\} \quad (2),$$

E is the modulus of elasticity, h is the thickness of the plate and v is Poissons' Ratio. The constant $C_v$ is 1/384.

In this example, the maximum deflection δ (Eq. 1) for an illustrative "plate" having a thickness of 25 μm (e.g., a thin PET foil for top substrate 120) at applied pressures 0.1 atm<q<10 atm is depicted in FIG. 8 as a function of L. The layer thickness of the E Ink layer (106 in FIG. 2) in this example is 50 μm. It can be seen in FIG. 8 that only at small pressures (<0.2 atm) and a span length L<1 mm, acceptable deflections of the 25 μm PET foil (top substrate 120) are obtained for this application.

Referring again to FIG. 2, to prevent deflection over conductor 110 in the common contact area during lamination of front plane 102, it is advantageous to use dimensions of <1 mm for the cavity 145 to withstand lamination. Combining this with a low pressure during lamination makes it possible to use a conductive adhesive 115 without the use of spacers 125, which may, if employed, damage the underlying conductive layer 108 (e.g. ITO layer) of the front plane 102.

It should be noted that at a significant deflection of the deformed substrate is the top substrate is (severely) tensile loaded. A significant tensile strain (e.g., >0.5%) also may introduce cracks in the underlying conductive layer 108 (ITO layer). A deflection below 40 μm at 1.0 mm span length is preferred in this example.

Figure 9:
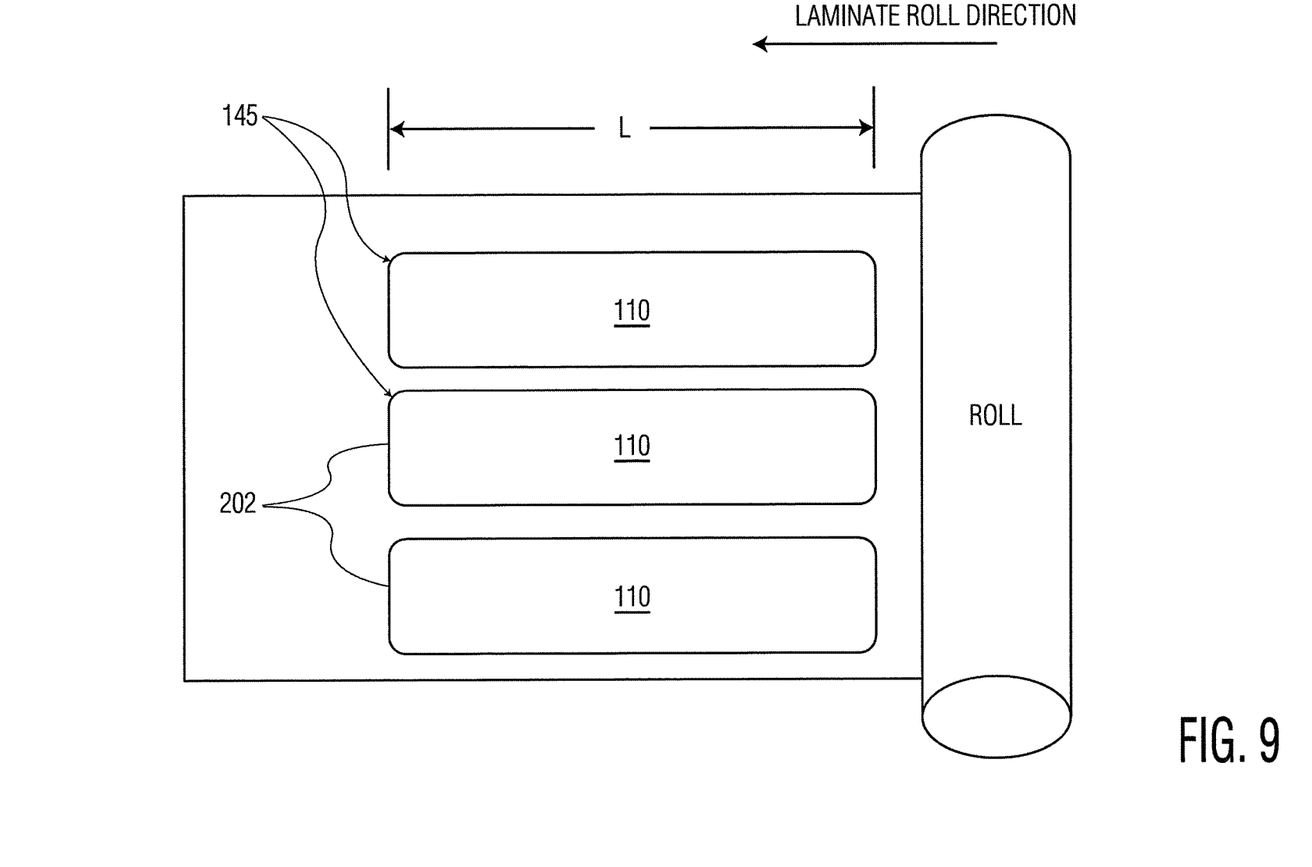
FIG. 9 is a diagram showing one orientation of one or more common contact conductors to permit favorable results while employing a liquid conductive material for an electrical connection between back and front planes.

The design of the area on the front panel laminate where the E-Ink capsules are removed to form cavity 145 should be such that the dimension parallel to the lamination roll direction is L<1 mm as indicated in FIG. 9. In FIG. 9, contact areas 202 for conductors 110 are shown. Conductors 110 are formed in cavities 145.

Figure 10:
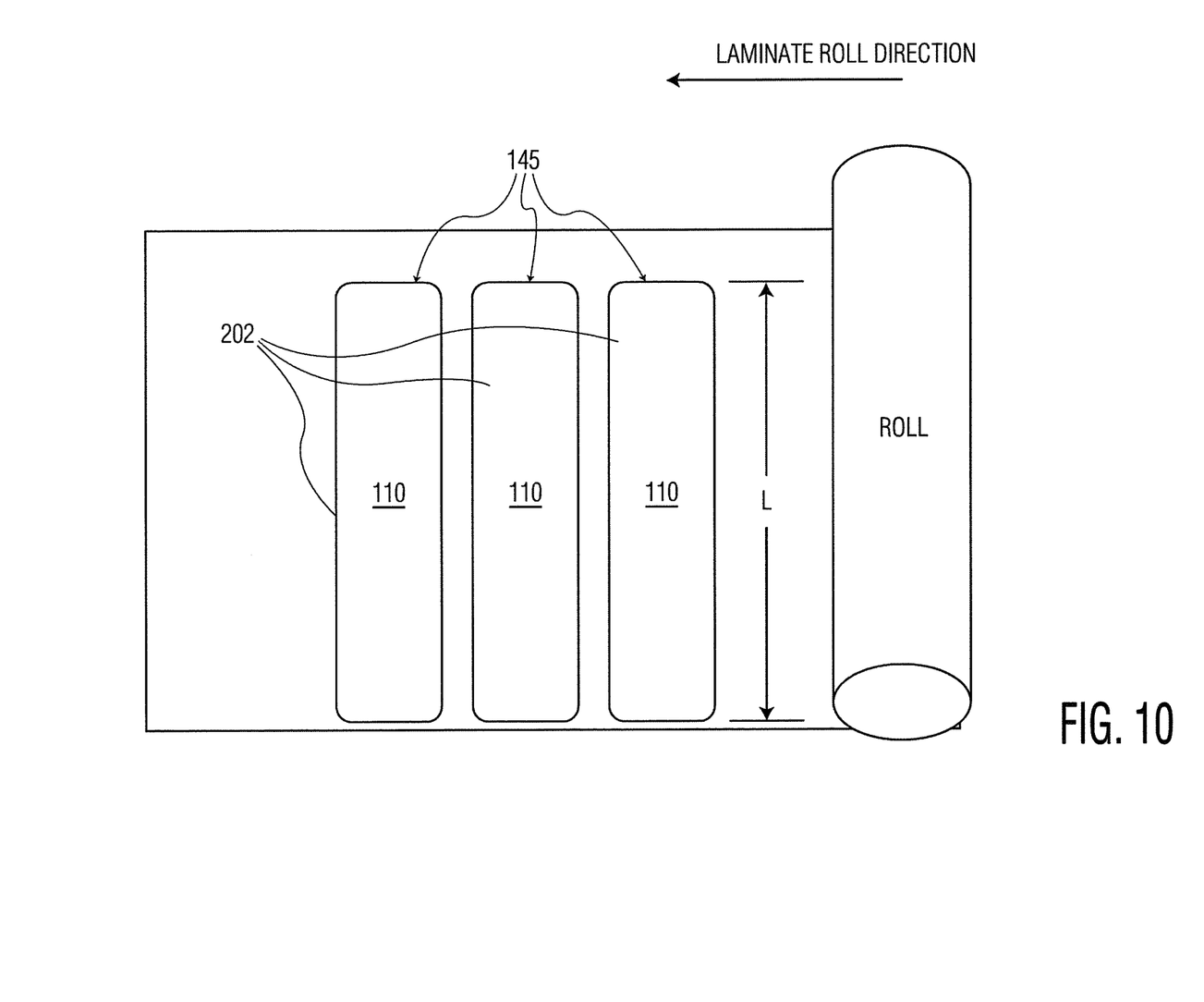
FIG. 10 is a diagram showing another orientation of one or more common contact conductors to permit favorable results while employing a liquid conductive material for an electrical connection between back and front planes.

FIG. 10 shows a top view of contact areas 202 where conductors 110 are formed. A number of areas 202 may be formed perpendicular to the lamination roll direction. The length will be the larger dimension than the width.

A preferred way to make a common contact would be to make the cavity 145 large in both the X and Y directions e.g. >>1 millimeter. This would make it easy for alignment of a conductive region between the front and back planes and give a relatively large volume of the conducting paste/liquid, which can be reliably dosed. With respect to reliability of the electrical connection/conductor, it is also preferable to have a large common contact region. However, this is difficult due to the mechanical issues as described above. It is therefore preferable to make the contact region large in at least one dimension and not necessarily in both dimensions in the XY plane.

For a given substrate thickness, permitted dimensions for the cavity size may be larger or smaller than 1 mm. In one example, L might be larger than 1 mm with substrate thicknesses greater than about 100 microns-200 microns. Also, more rigid devices may have larger dimensions for L.

Figure 11:
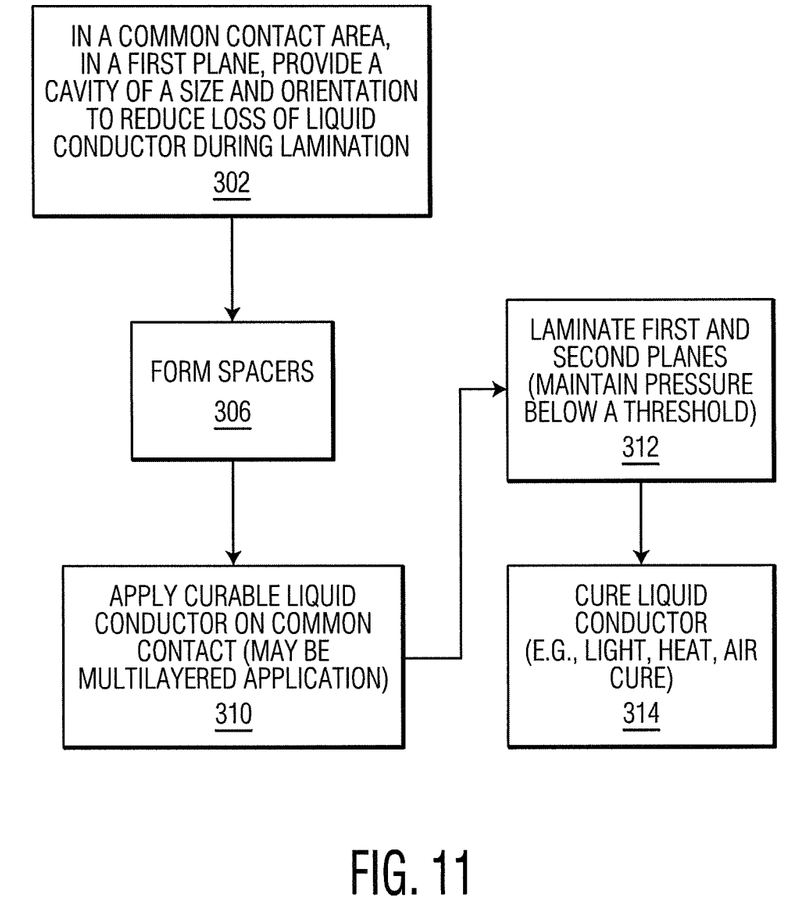
FIG. 11 is a flow diagram showing steps for fabricating a flexible display in accordance with an illustrative embodiment.

Referring to FIG. 11, a method for fabricating a flexible display is illustratively shown. In block 302, a common contact site is formed of an appropriate size to limit height reduction as a result of lamination. A cavity of the proper dimension is provided in at least a first plane to prevent loss of the electrical connection due to pressure applied during the laminating step. The opening is preferably maintained at a width and/or a length of less than about 1 mm. Other dimensions may be employed based on the size of the substrate and/or the application. The common contact conductor is formed in or fits in the cavity.

In block 306, spacers may be formed in the cavity in the common contact region to prevent loss of the electrical connection due to pressure applied during the laminating step. The spacers are formed, preferably before application of the adhesive material. Spacers, preferably sphere spacers, may be present in the adhesive tape or in the viscous adhesive material (liquid or paste). When liquid (or viscous) adhesive is applied, (rib or column) spacers might be formed, for example using lithographic techniques.

In block 310, a curable conductive liquid is applied to form the common contact conductor in the cavity of the common contact region. This may include printing the curable conductive liquid on the common contact. The application of the curable conductive liquid may be applied in a multistep process to form a multilayer conductive connection. (And can in principle be on either side e.g., on planes 102 or 103).

In block 312, a second plane is laminated to the first plane providing electrical continuity through the electrical connection. The laminating preferably includes maintaining pressure applied below a threshold to prevent loss of the electrical connection during the laminating step. In block 314, the curable conductive liquid is cured to form an electrical connection. The curing may include, e.g., heat, or light using appropriately curable materials.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function; and e) no specific sequence of acts is intended to be required unless specifically indicated.

Having described preferred embodiments for improved common contact layout for flexible displays (which are intended to be illustrative and not limiting), it is noted that modifications and variations can be made by persons skilled in the art in light of the above teachings. In particular, the inventive concept can also be applied in other non-display devices wherein electrical connections are provided as defined in the annexed claims. It is therefore to be understood that changes may be made in the particular embodiments of the disclosure disclosed which are within the scope and spirit of the embodiments disclosed herein as outlined by the appended claims. Having thus described the details and particularity required by the patent laws, what is claimed and desired protected by Letters Patent is set forth in the appended claims.

The invention claimed is:

1. An electronic device, comprising:
a first plane and a second plane wherein one of the planes is deformable under mechanical pressure;
a common contact region comprising a cavity formed in at least one of the first and second planes; and
an electrical connection configured to complete an electrical connection between the first and second planes wherein the electrical connection includes a solidified form of a liquid conductor dispensed in the cavity to complete an electrical path between the first and second planes,
wherein the electrical connection includes one of a polyaniline mixed with carbon nanotubes and polythiophene derivative/polystyrene sulphonic acid;
wherein the electrical connection includes a multiple layer adhesive.

2. The display as recited in claim 1, wherein the electrical connection includes a curable liquid.

3. The display as recited in claim 1, further comprising spacers disposed in the cavity to provide rigidity against deflection of the second plane during assembly of the display.

4. The display as recited in claim 1, wherein the cavity is formed in the first plane and the cavity includes a selected dimension to reduce loss of the conductor during lamination between the first plane and the second plane.

5. The display as recited in claim 4, wherein the dimension includes a width of less than about 1 mm.

6. The display as recited in claim 1, wherein the cavity includes a length dimension parallel to a direction of rolling of a lamination roll.

7. The display as recited in claim 4, wherein the cavity includes a length dimension perpendicular to a direction of rolling of a lamination roll.

8. The display as recited in claim 1, wherein the second plane includes a front plane laminate and the first plane includes an active matrix back plane.

9. A flexible display device, comprising:
a first plane;
a second plane;
a common contact location, formed on one of the first and second planes;
an electrical connection configured to complete an electrical connection between the first and second planes in the common contact location wherein the electrical connection includes a sticker having isotropic conductive wires applied to a conductive material in the common contact area to complete an electrical path between the first and second planes,
wherein the electrical connection includes one of a polyaniline mixed with carbon nanotubes and polythiophene derivative/polystyrene sulphonic acid;
wherein the electrical connection includes a multiple layer adhesive.

10. A method for fabricating a flexible display, comprising:
forming a cavity in a first plane in a common contact area;
applying a curable conductive liquid in the cavity;
laminating a second plane to the first plane; and
curing the curable conductive liquid to form an electrical connection providing electrical continuity through the electrical connection between the first and second planes;
wherein the electrical connection includes one of a polyaniline mixed with carbon nanotubes and polythiophene derivative/polystyrene sulphonic acid;
wherein the electrical connection includes a multiple layer adhesive.

11. The method as recited in claim 10, wherein applying a curable conductive liquid in the cavity includes contacting the conductive liquid with an underlying conductive layer in the first plane.

12. The method as recited in claim 10, wherein applying a curable conductive liquid includes printing the curable conductive liquid in the cavity.

13. The method as recited in claim 10, wherein curing includes curing using at least one of light, and heat.

14. The method as recited in claim 10, wherein forming a cavity includes forming the cavity with a dimension configured to prevent loss of the electrical connection due to pressure applied during the laminating step.

15. The method as recited in claim 14, wherein forming the cavity includes maintaining the dimension of less than about 1 mm.

16. The method as recited in claim 14, wherein forming the cavity includes maintaining a length dimension parallel to a direction of rolling of a lamination roll.

17. The method as recited in claim 14, wherein forming the cavity includes maintaining a length dimension perpendicular to a direction of rolling of a lamination roll.

18. The method as recited in claim 10, further comprising forming spacers in the cavity to prevent loss of the electrical connection due to pressure applied during the laminating step.

19. The method as recited in claim 10, wherein laminating includes maintaining pressure applied below a threshold to prevent loss of the electrical connection during the laminating step.

20. The display as recited in claim 1, wherein the first plane is deformable and comprises a top substrate, a conductive layer formed on the top substrate, and an electrophoretic layer formed on the conductive layer, wherein the cavity is formed through the electrophoretic layer and between the second plane and the conductive layer, and wherein the electrical connection fills the cavity so as to electrically connect the second plane and the conductive layer.

\* \* \* \* \*